United States Patent [19]

Rothweiler

[11] Patent Number: 4,691,292
[45] Date of Patent: Sep. 1, 1987

[54] SYSTEM FOR DIGITAL MULTIBAND FILTERING

[75] Inventor: Joseph H. Rothweiler, Bloomfield, N.J.

[73] Assignee: RCA Corporation, Princeton, N.J.

[21] Appl. No.: 484,526

[22] Filed: Apr. 13, 1983

[51] Int. Cl.[4] ............................................. G06F 7/38
[52] U.S. Cl. .................................................... 364/724
[58] Field of Search ............... 364/724; 333/165–167, 333/175; 328/167; 370/70; 375/26, 34, 61; 381/29–37

[56] References Cited

U.S. PATENT DOCUMENTS

| | | | |
|---|---|---|---|
| 3,360,610 | 12/1967 | Flanagan | 381/37 |
| 3,845,390 | 10/1974 | De Jager et al. | 375/13 |
| 3,979,677 | 9/1976 | Bagdasarjang | 375/14 |
| 4,001,510 | 1/1977 | Reed | 370/70 |
| 4,028,535 | 6/1977 | Franaszek et al. | 364/724 |
| 4,125,866 | 11/1978 | Van Essen et al. | 333/166 |
| 4,131,766 | 12/1978 | Narasimha | 370/70 |
| 4,170,719 | 10/1979 | Fujimura | 381/29 |
| 4,264,983 | 4/1981 | Miller | 333/166 |
| 4,300,229 | 11/1981 | Hirosaki | 370/70 |
| 4,316,282 | 2/1982 | Macina | 370/70 |
| 4,326,261 | 4/1982 | Peoples | 364/724 |
| 4,339,724 | 7/1982 | Feher | 375/61 |
| 4,393,456 | 7/1983 | Marshall, Jr. | 364/724 |
| 4,416,179 | 11/1983 | Wachi | 364/724 |
| 4,538,234 | 8/1985 | Honda et al. | 381/31 |
| 4,569,075 | 2/1986 | Nussbaumer | 381/34 |

OTHER PUBLICATIONS

Nussbaumer, "Implementation of Transmultiplexers by Polynomial Transforms", IBM Technical Disclosure Bulletin, vol. 24, #6, pp. 3074–3080, Nov. 1981.
Nussbaumer, "Pseudo QMF Filter Bank", IBM Technical Disclosure Bulletin, vol. 24, #6, pp. 3081–3087, Nov. 1981.
Nussbaumer, "Nesting Implementation of Digital Filter Banks", IBM Technical Disclosure Bulletin, vol. 24, #6, pp. 3068–3073, Nov. 1981.
Croiser et al., "Coding a Band Split Signal," *IBM Technical Disclosure Bulletin,* vol. 19, No. 9, pp. 3438–3439, Feb. 1977.

*Primary Examiner*—Archie E. Williams, Jr.
*Assistant Examiner*—Dale M. Shaw
*Attorney, Agent, or Firm*—Clement A. Berard, Jr.; Henry I. Schanzer; William H. Meise

[57] ABSTRACT

A digital filter system in which the frequency spectrum of an input signal is divided into M consecutive subbands. Each subband is generated by multiplying the impulse reponse of a low pass filter by a sinusoid (sine or cosine) whose frequency is equal to the center frequency of its respective subband. The sinusoids of adjacent bands are phase shifted by 90° relative to each other to establish a condition enabling aliasing components to be cancelled when the subbands are recombined.

6 Claims, 13 Drawing Figures

SYSTEM FOR DIGITAL MULTIBAND FILTERING

This invention relates to means for digitally filtering and processing signals.

In digital signal processing a continuous signal is not treated as a continuous wave, as in the case with analog circuits, but rather as a sequence of numbers obtained by measuring (sampling) the instantaneous value of the continuous signal at fixed intervals of time. Nyquist demonstrated that sampling a continuous signal at a sampling frequency (fs) generates images (replicas) of the signal's spectrum offset from the original by multiples of fs, as shown in FIG. 11. If the Nyquist Criterion is met, in that the sampling frequency (fs) is at least 2 times the maximum frequency (fMAX) of the signal being sampled, the "images" generated by sampling will not overlap and the original analog signal can be recovered from the sampled data by lowpass filtering to remove the images. However, if the signal being sampled at a frequency fs has frequency components above fs/2, the images will overlap the signal spectrum, whereby an attempt to recover the analog signal by lowpass filtering will include parts of the image as well as the original signal. The unwanted (or error) image components which appear as part of the signal are referred to as aliasing components.

The elimination of aliasing by using a sufficiently high sampling frequency (fs) is an obvious but impractical solution since it requires the generation of more samples within a given time, and involves the transmission of more data bits which is very expensive. Therefore, techniques of interest are those that can transmit signals at a reduced rate while still maintaining the quality of the original signal.

One such technique is subband coding (SBC), in which the full input signal frequency bandwidth is partitioned by means of a filter into frequency bins called subbands. SBC is used to achieve a reduction in the number of data bits transmitted per second as a result of two factors: (1) some subbands contain no useful signal frequencies, so the information in those subbands need not be transmitted; and (2) more efficient use of a given data transmission rate can be obtained by allocating a greater number of bits to those subbands which contain more useful information and fewer bits to those subbands which contain less meaningful information.

A problem occurs with subband coding when the transmission rate (e.g., 8000 words/sec.) of the signals at the output of the filter performing the subband coding is to be no greater than the transmission rate (e.g., 8000 words/sec.) of the signals at the input to the filter bank. For example, assume that a serial stream of data whose maximum signal frequency component is fMAX and which is sampled at a rate (fs) equal to 2fMAX is applied to the filter bank which, using principles of SBC, divides the bandwidth (fMAX) of the signal into M parallel subbands each subband having a bandwidth of fMAX/M. To maintain the transmission rate constant the sampling rate (fsb) of the data within each one of the M subbands must be reduced (i.e. ("desampled") to $fsb = fs/M = 2fMAX/M$. If infinitely sharp filters were available, the signals in each of the M subbands being sampled at $fsb = 2fMAX/M$ would contain only frequency components within its subband. However, since infinitely sharp filters are unavailable, the signal in each subband includes unwanted or error components (i.e. aliasing components) from adjacent bands.

A recently developed technique known as quadrature mirror filters (QMF) teaches the divsion of the full bandwidth (fMAX) of an input signal sampled at fs=2fMAX into two parts, to produce two symmetric (hence, mirror) subbands, such subband having ½ the full bandwidth and each being sampled at fs=fMAX. To provide finer divisions of the signal frequency band, quadrature mirror filter sections may be cascaded in a tree structure. Thus, each of the two bands can in turn be subdivided into two, to produce 4 bands, each one of the 4 bands having ¼ of the bandwidth of the original input signal. The process of dividing each subband by two can again be repeated to obtain a still finer division.

In the QMF filter method, corresponding to the formation of a bandpass filter to obtain a signal band, a quadrature filter is formed by negating alternate samples of the impulse response of the band pass filter. The eventual reconstruction of the bandpass filtered signal and the signal resulting from its corresponding quadrature filter enables the cancellation of the aliasing component. However, the QMF method is limited to binary type division and requires some type of multi-stage tree type structure or its equivalent. The technique does not lend itself to odd or non-binary division and, in many applications, this results in an implementation which is not efficient since it requires more time, computations and/or equipment. Variations of the QMF method exist in which banks of parallel filters are used to stimulate a tree structure. Because these structures are generated by mathematical transformation of QMF tree structures, they share the restriction to binary type division. Also, only modest increases in efficiency are obtained by using these variations.

Systems embodying the invention include means for directly dividing the frequency spectrum of an input signal into any number of subbands and producing all the subbands concurrently.

A system embodying the invention includes means for dividing the spectrum of an input signal into consecutive subbands. Each subband is produced by multiplying the impulse response of a low pass filter by a sinusoid having a specific frequency and phase. The frequency of the sinusoid for generating a subband is set equal to the center frequency of that subband. The phases of the sinusoids are chosen such that the sinusoids of adjacent bands are shifted in phase by 90 degrees relative to one another. An example is the use of sine functions to generate odd numbered subbands (1, 3, etc.) and cosine functions to generate even numbered subbands (2, 4, etc.). Proper phasing of the sinusoids enables cancellation of aliasing between adjacent bands; i.e., the aliasing error present at the high frequency end of one subband cancels the aliasing error present at the low frequency end of the next high frequency subband. Proper design of the lowpass filter produces a nearly flat frequency response at signal reconstruction.

In the accompanying drawing like reference characters denote like components; and FIG. 1 is a block diagram of a transmitter/receiver system including filter banks embodying the invention;

Figure 1:
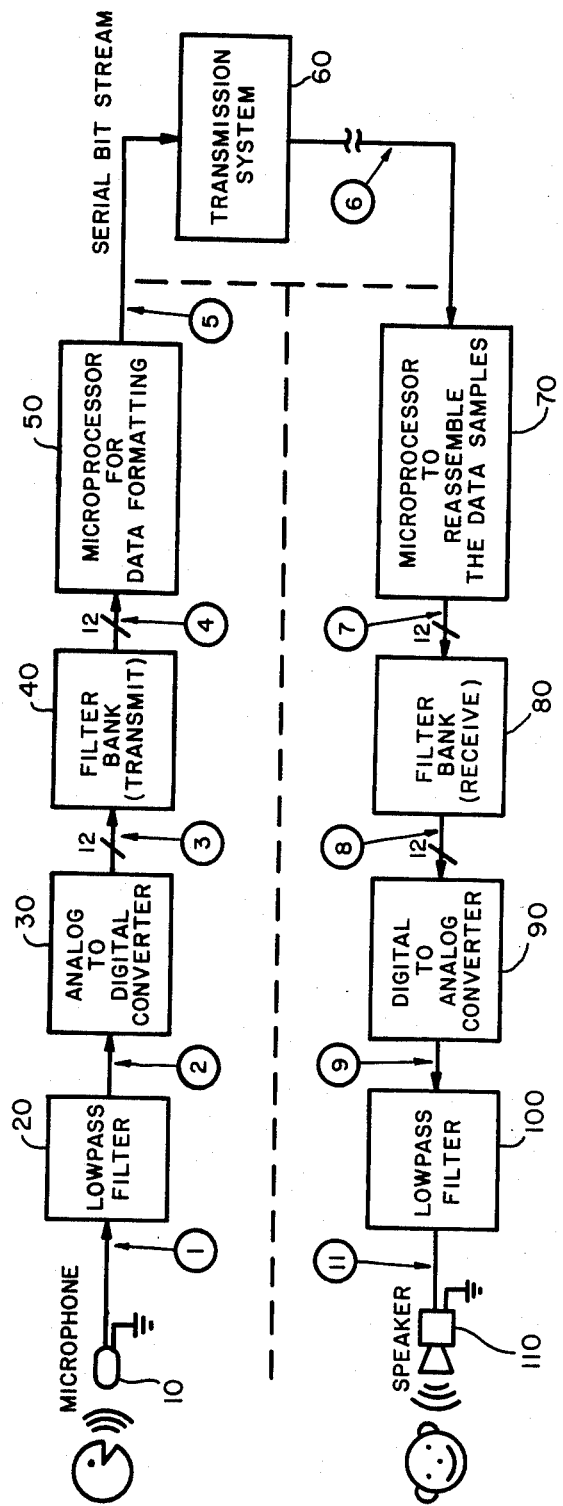

In the sytem of FIG. 1, a microphone 10 picks up audio (speech) signals and produces a signal at ① which is applied to a low pass filter 20. Filter 20 is an analog lowpass filter which filters out all frequency components above 4 KHz producing an analog signal at its output ② having a maximum bandwidth (fMAX) of 4 KHz this signal is applied to an analog-to-digital (A/D) converter 30 in which the signal is sampled at an 8 KHz rate (i.e. the sampling frequency, fs, is 2fMAX) and the amplitude of each sample is digitized into a 12 bit binary number. Thus A/D converter 30 produces at its output ③ a signal whose maximum frequency (fMAX) component is 4 KHz and which is sampled at an 8 KHz rate with each sample represented by a 12 bit number. The number (e.g. 12) of bits determines the resolution of the sample. If less resolution is necessary each sample may be digitized using a lesser (e.g. 8) number of bits. On the other hand, if a higher level of resolution is required the A/D converter would be designed to produce a larger number, (e.g. 16) of bits per sample. As 12 line bus connects the output of A/D converter 30 to filter bank 40 as indicated by the slash in the line connecting the two blocks and the number 12. The 12 bits comprising each sample are thus fed in parallel from converter 30 to filter 40.

Filter bank 40 whose characteristics and principles of operation are discussed in detail below, functions to desample the sampled signals from the 8 KHz sampling rate to a 1 KHz rate. In addition, filter bank 40 functions to divide the 4 KHz signal spectrum into 8 subbands, each subband being 500 Hz wide and each being sampled at a 1 KHz rate. The 8 subbands are then multiplexed within the filter and a resultant 12 bit wide multiplexed signal is produced at output ④ of filter 40. The multiplexed output at ④ is serially transferred together with timing signals (not shown) to synchronize the data transfer along the 12 line bus to microprocessor 50 for data formatting. The microprocessor 50 collects groups (e.g. 128 words) of samples (e.g. 16 from each of the 8 subbands or channels), and generates a block of (e.g. 256) data bits for transmission at its output ⑤. This block of data contains encoded sample values and gain codes for each channel, and it may also contain bits for synchronization and error protection. Methods of performing this encoding are known in the art and are not detailed here. The microprocessor produces a serial stream of data bits at ⑤ to be transmitted via a transmission system 60 to a microprocessor 70. The transmission system 60 may be any suitable digital transmission system such as a pair of modems connected by telephone lines or a fiber optic or radio link.

The transmitted data at ⑥ is received by a receiver microprocessor 70 which decodes each block of (e.g. 256) data bits to recover the encoded (e.g. 128) samples. The recovered samples will be slightly distorted by the encoding the decoding processes, but this distortion is minor with properly chosen coding algorithms.

The recovered samples at the output ⑦ are applied to, and processed by, a filter bank 80 which functions to recombine the eight bands of 500 Hz into a single signal of 4 KHz width and in which aliasing components are cancelled as detailed in the description of filter 80 to follow. The recombined signal appearing at ⑧ will be essentially the same as the original digitized signal at point ③. The signal at ⑧ is then applied to a Digital-to-Analog (D/A) converter 90 whose output ⑨ is applied to a low pass filter whose output 11 is applied to a speaker 110 to reproduce the original speech signal into microphone 10.

Figure 2:
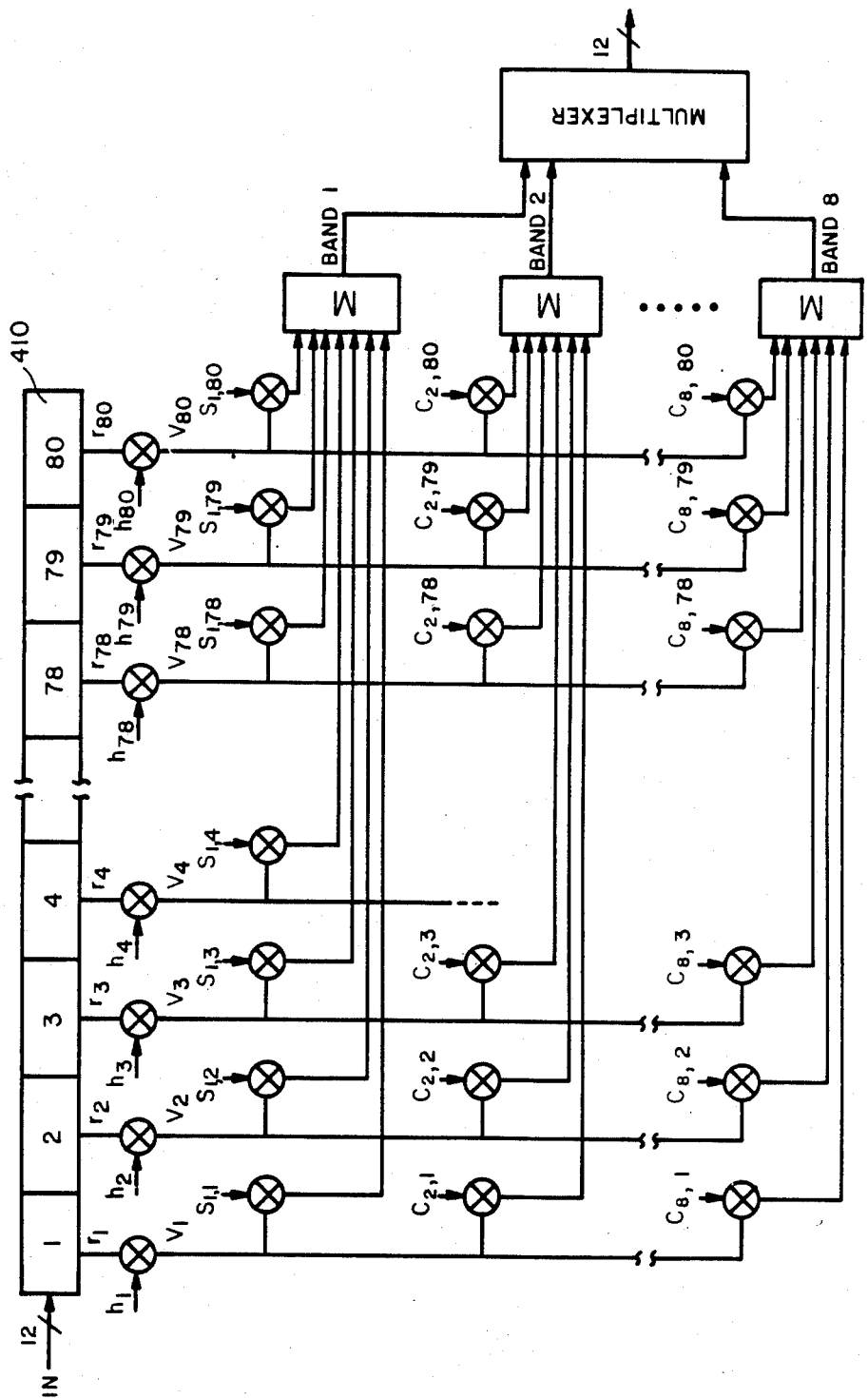
FIGS. 2 and 3 are functional block diagrams of transmit filter banks embodying the invention.

Reference is now made to FIG. 2 which is a functional diagram of a filter bank embodying the invention. Recall that A/D converter 30 produces sampled signals at ③ at an 8 KHz rate. Thus, every 125 microseconds, a sampled signal ($r_i$) which is 12 bits wide is applied to the input (IN) of transmit filter bank 40. Filter bank 40 includes an 80 stage storage means, i.e. shift register 410, for storing 80 $r_i$ data samples of 12 bits each. (The 12 bit width of each register is not shown). Filter bank 40 includes multiplication means, shown by a multiplication symbol X inscribed within a circle, which, for example, could be a model MPY-16HJ integrated circuit manufactured by the TRW Corporation, for multiplying each $r_i$ sample by a corresponding $h_i$ coefficient to produce a corresponding signal $v_i$.

The $h_i$ coefficients are the coefficients of a low pass prototype filter and define the impulse response of the low pass prototype filter. Where the frequency spectrum of the input signal extends from zero Hz to fMAX and is to be divided into M subbands, the bandpass of the low pass prototype filter is set equal to fMAX/2M and is designed to have a frequency response similar to that shown in FIG. 12. For example, where fMAX=4 KHz and M=8, $fMAX/2M$=250 Hz. A method for determining the values of the respective $h_i$ coefficients is discussed below.

Multiplying the impulse response of the low pass prototype filter having a bandpass of fMAX/2M by a sinusoid having a frequency equal to, or greater than, fMAX/2M changes the lowpass filter into a bandpass filter having a bandwidth equal to fMAX/M. This is so because the frequency of the sinusoid determines the center frequency (cf) of the filter and the bandpass of the filter extends ±fMAX/2M about the frequency of the sinusoid. Thus, for example, by multiplying the $h_i$ coefficients of the low pass prototype filter of bandpass fMAX/2M by a first sinusoid (sine or cosine) function whose frequency equals (fMAX/2M)Hz produces a first bandpass filter extending from 0 Hz to (fMAX/M)Hz with a center frequency of fMAX/2M. By multiplying the $h_i$ coefficients by a second sinusoid having a frequency of [fMAX/2M+fMAX/M] a second bandpass filter is obtained extending from fMAX/M to 2fMAX/M whose center frequency is equal to the frequency of the second sinusoid, i.e. 3/2 fMAX/M. By repeatedly multiplying the $h_i$ coefficients of the low pass prototype filter by sinusoids which are shifted up in frequency in steps of fMAX/M, additional bandpass filters are generated until a total of M bandpass filters are produced.

Each one of the M filters (or subbands) is designed to capture or include the frequency components of a particular fMAX/M portion of the frequency spectrum of the input signal. In FIG. 2, this is accomplished by first multiplying the samples $r_i$ by corresponding $h_i$ coefficients to produce $V_i$ signals, and then multiplying the $V_i$ signals by appropriate coefficients of various sinusoids. However, it should be appreciated that the $h_i$ coefficients could first be multiplied by corresponding coefficients of the sinusoids and their product could then be multiplied by the corresponding $r_i$ samples.

In a particular embodiment where fMAX=4000 Hz and the number of desired subbands (M) is equal to 8, the bandpass of the low pass filter is designed to be 250 Hz (i.e. fMAX/2M). Eight bandpass filters, each having a bandpass of 500 Hz, are produced by multiplying the $h_i$ coefficients of the low pass filer by 8 sinusoids whose frequencies are increased in increments of 500 Hz, with the frequency of the first (lowest frequency) sinusoid being set at 250 Hz. The bandpass of the first filter extends from 0 Hz to 500 Hz, the bandpass of the second filter extends from 500 Hz to 1000 Hz, etc . . . , with the bandpass of the 8th filter extending from 3.5 KHz to 4 KHz.

In FIG. 2, each band of the M (e.g. 8) bands is generated by multiplying $V_i$ (i.e., $r_i \cdot h_i$) by a sinusoid (sine or cosine) function whose frequency is equal to the center frequency of the desired band. The mid point or center frequency ($cf_m$) of each band ($U_m$) may be calculated as follows:

$$cf_m = [fMAX/2M] \cdot (2m-1) \qquad \text{eq. A}$$

where cf is equal to the center frequency of a band; M is the selected number of bands; and m varies from 1 to M. For fMAX=4 KHz, and M=8 the $cf_m$ of the 8 bands is as follows: $cf_1$=250 Hz; $cf_2$=750 Hz; $cf_3$=1250 Hz; $cf_4$=1750 Hz; $cf_5$=2250 Hz; $cf_6$=2750 Hz; $cf_7$=3250 Hz; and $cf_8$=3750 Hz A desired subband is produced by multiplying the $V_i$ products by a sinusoidal function having a frequency equal to the center frequency of the desired subband. To achieve the cancellation of aliasing, as discussed below, the phases of these sinusoids must also be properly chosen. In particular, there must be a 90 degree phase shift between the sinusoidal functions used to generate adjacent bands. This may be accomplished, for example, as shown in FIG. 2, by multiplying the $V_i$ products by sine functions to obtain the odd numbered bands ($U_1$, $U_3$, $U_5$, $U_7$) and by cosine functions to obtain the even numbered bands ($U_2$, $U_4$, $U_6$, $U_8$).

Figure 13:
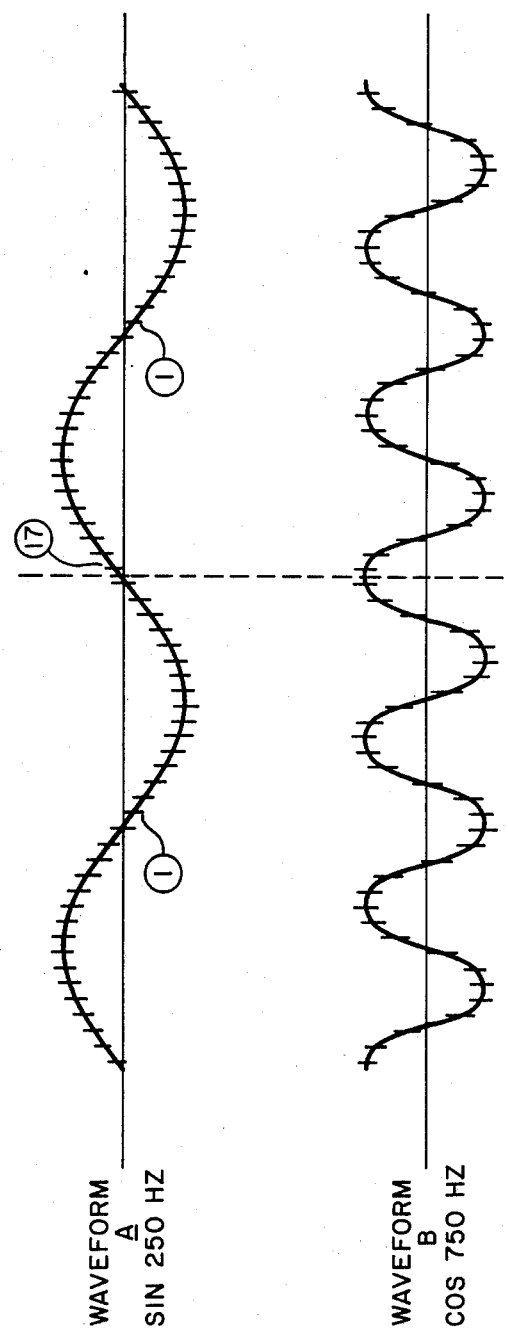
FIG. 13 is a drawing of two sinusoids suitable for use in a filter bank embodying the invention.

The values of the sine and the cosine functions to multiply the $V_i$ products are obtained by taking samples of the respective sine and cosine functions at equal intervals as illustrated for sin 250 Hz and cos 750 Hz in waveforms A and B of FIG. 13. Note that in FIG. 13, the sinusoids are divided into 64 equal intervals to produce the coefficients for a 64 stage register. Where an 80 stage shift register is used as in FIG. 2, 80 coefficients would be generated. Following the multiplications of the $V_i$'s by the corresponding coefficients of the sinusoids, the products are summed to produce 8 outputs or bands, which may be represented as follows:

$$\text{BAND } 1 = U_1 = V_1 S_{1,1} + V_2 S_{1,2} + V_3 S_{1,3} + \ldots$$
$$+ V_{80} S_{1,80} \qquad \text{eq. B1}$$

$$\text{BAND } 2 = U_2 = V_1 C_{2,1} + V_2 C_{2,2} + V_3 C_{2,3} + \ldots$$
$$+ V_{80} C_{2,80} \qquad \text{eq. B2}$$

$$\text{BAND } 8 = U_8 = V_1 C_{8,1} + V_2 C_{8,2} + V_3 C_{8,3} + \ldots$$
$$+ V_{80} C_{8,80} \qquad \text{eq. B8}$$

Where $S_1$=Sin 250 Hz; $S_3$=Sin 1250 Hz; $S_5$=Sin 2250 Hz; $S_7$=Sin 3250 Hz; $C_2$=COS 750 Hz; $C_4$=COS 1750 Hz; $C_6$=COS 2750 Hz; and $C_8$=COS 3750 Hz; and where, for example, $S_{1,1}$, $S_{1,2}$, $S_{1,3}$ are 1st, 2nd and 3rd coefficients of sin 250 Hz taken at regular intervals along waveform A of FIG. 13. A set of coefficients for two of 8 sinusoids where fMAX=4000, fs=8000 and M=8 may be calculated as follows:

$$S_{1,i} = \sin[2\pi(i - N/2\tfrac{1}{2})(250/8000)] \qquad \text{eq. c1}$$

$$C_{2,i} = \cos[2\pi(i - N/2\tfrac{1}{2})(750/8000)] \qquad \text{eq. c2}$$

For a 64 stage, 64 coefficient filter system, N is set equal to 64 and n ranges from 1 to 64. The coefficients for a sine function other than 250 and for a cosine function other than 750 may be calculated by replacing the corresponding numbers 250 and 750 in eqs. C1 and C2 by appropriate values. As shown in FIG. 13, the cosine function is positioned such that it is symmetric about the center of the filter, while the sine function is antisymmetric.

It should be clear from the discussion above that by multiplying $V_i$, which is the product of $r_i$ and $h_i$, by the sine of 250 Hz, the frequency components of the input signal between 0 and 500 Hz are obtained; likewise, by multiplying $V_i$ by the cosine of 750 Hz, the frequency components of the input signal between 500 Hz and 1 KHz are obtained. Repeating the process for each consecutive band produces 8 outputs of 8 filter bands each output or band containing the frequency components of the input signal within that band.

Furthermore, as detailed below, applicant discovered that by generating every other subband by using a sine function and the remaining subbands by using a cosine function, the aliasing components produced during desampling (described below) are cancelled when the subbands are eventually recombined.

Figure 8:
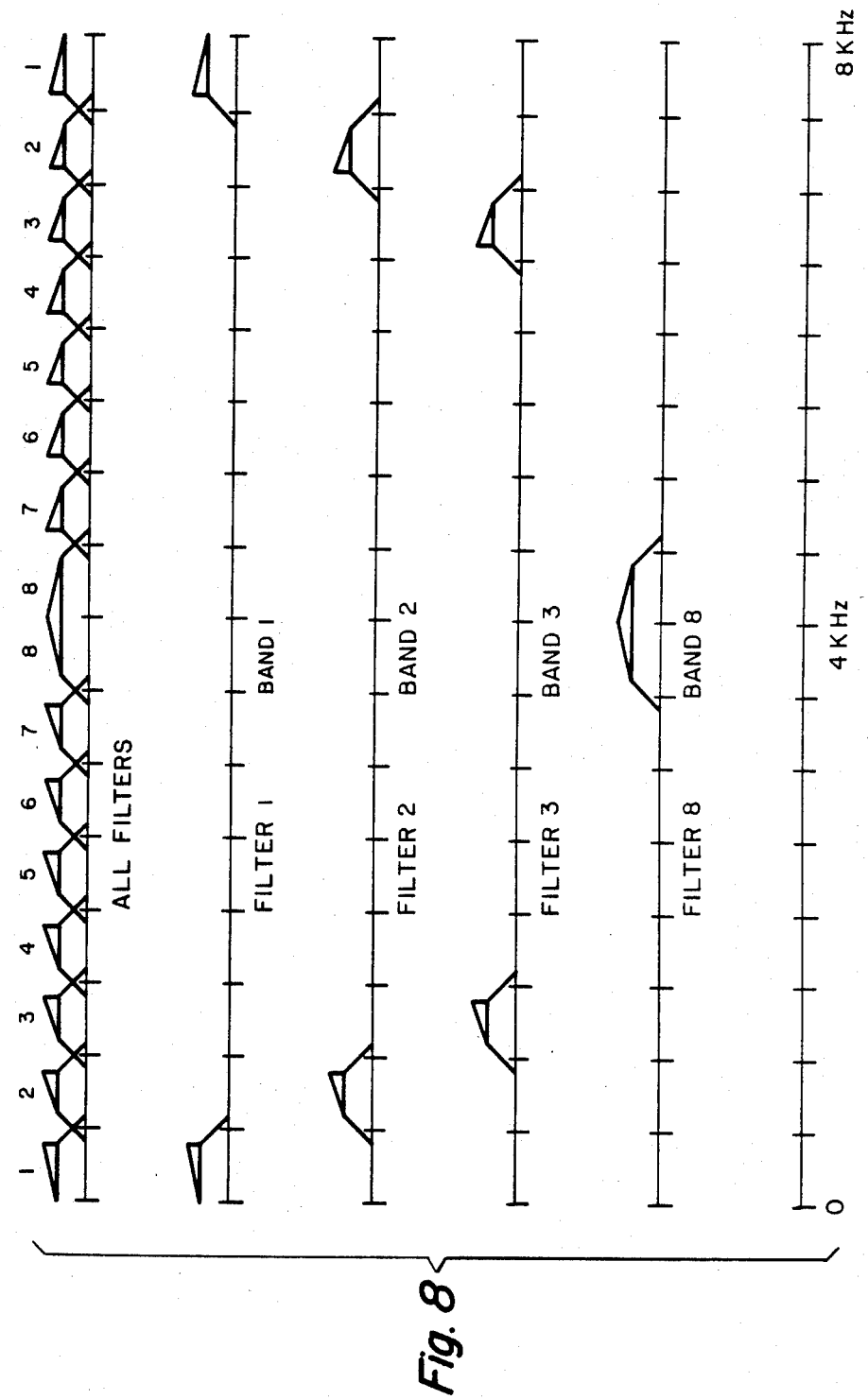
FIGS. 8, 9 and 10 are spectrum plots of signals associated with filter banks.

Recall that the input signal applied to filter bank 40 has a bandwidth of fMAX=4 KHz and that it is sampled at an 8 KHz rate (i.e. fs=2fMAX) and that a 12 bit wide digitized (sampled) signal is continuously fed at an 8 KHz rate into shift register 410. Thus, every 125 microseconds, the information in register 410 is shifted one stage to the right so that a new sample (12 bit wide) is stored in the first stage (i.e. 1) of the register and the information previously in stage 1 is advanced to stage 2. Therefore, at any point in time, the 80 most recent data samples are available in the 80 stages of register 410. If the multiplication of each new sample by the $h_i$ and sinusoid coefficients were made every 125 microseconds (i.e. at an 8 KHz rate) the spectrum of each band would be as shown in the waveforms of FIG. 8. However, in order to keep the data rate at the input to the microprocessor as low as possible, the multiplication of the sampled data stored in register 410 occurs only at a 1 KHz rate, that is, once every millisecond. Consequently, samples in bands 1 through 8 are generated at a 1 KHz rate while the input is sampled at 8 KHz. Reducing the sampling rate is known as "desampling". Desampling is employed to maintain the transmission rate of the data at the output of the filter equal to that at its input. Since the filter has 8 parallel output bands and one serial input, the sampling rate of the data on each one of the 8 parallel band lines is set at $\tfrac{1}{8}$th the rate of the input.

Figure 9:
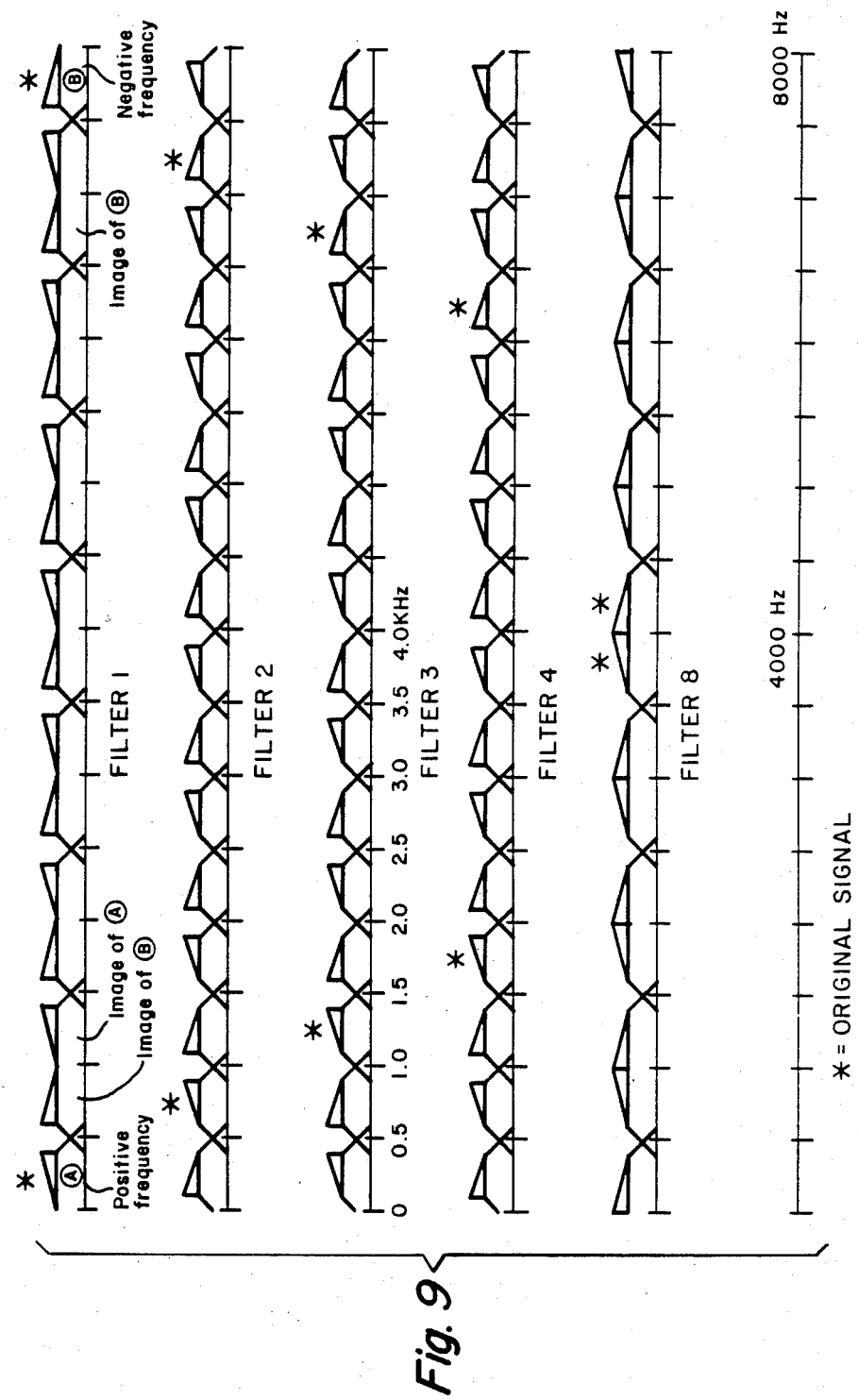

Thus, although information is supplied to register 410 at a rate of one new sample every 125 microseconds, computation on the 80 samples in the register is performed only once every millisecond as follows. At some time $t_l$, the 80 samples in register 410 are multiplied by the $h_i$ coefficients and by the sinusoids. While the filter bank is operating on the samples present in register 410 at time $T_l$, new samples are being fed into register 410. However, processing of the new samples being fed into register 410 does not occur until 8 new samples have been shifted into register 410. That is, 1 millisecond after $t_l$, after 8 new samples have been fed into stages 1 through 8 and the previously stored samples have advanced by eight states, the information in the register is processed (i.e. multiplication by $h_i$ and the sinusoids) anew. Thus, the information being fed into filter 40 at an 8 KHz rate is processed at a 1 KHz rate, effectively reducing the sampling frequency from 8 KHz to 1 KHz and causing the information in each band to contain a multiplicity of images as shown in the waveforms of FIG. 9. The "desampling" gives rise to aliasing problems since frequency components of adjacent bands now appear as part of the signal in a band of interest. The effect of desampling on spectral response of the signals in bands 1 through 8 may be more easily described with reference to FIGS. 8 and 9. The first line of FIG. 8 shows the frequency responses of the 8 filters on the same axis. Tic marks on the axis are 500 Hz apart, assuming a sampling rate of 8000 Hz. Note that the filters overlap substantially in frequency, and that the transition bands (the sloping edges of the filters) extend beyond the edges of the 500 Hz bands. The entire 8000 Hz spectrum is shown in these figures, so the positive frequency portions of the filters appear to the left side of the 4 KHz point, while the negative frequency portions are shown to the right side of the 4 KHz point.

For clarity of presentation, the frequency responses of 4 of the filters are shown on separate lines on the remaining lines of FIG. 8. These responses may be computed from the $h_i$ coefficients of the low pass filter and the sine/cosine functions.

As stated above, a signal having the frequency characteristics shown on the lines of FIG. 8 would be generated if the 8 bands were generated at an 8 KHz rate, i.e. after each input sample is shifted into register 410 of FIG. 2. But, since the sampling rate of the 8 bands is reduced to 1000 Hz, the resulting frequency spectra of the data appearing on the respective channels or band lines is then as shown in FIG. 9. The actual signal spectra in FIG. 9 are the same as if the signals shown in FIG. 8 had actually been generated at 8 KHz and then desampled to 1 KHz by discarding 7 of every 8 samples in each band. That is, the original signal spectrum appears in the correct place in the spectrum as indicated on the plot, together with copies of the spectrum at intervals of the sampling rate (1 KHz). The signal images overlap significantly at a frequency of 500 Hz, so aliasing exists in the desampled signal. However, multiplying the bands by properly phased sinusoids, as taught herein, enables the aliasing components to be cancelled when the signal is eventually reconstituted.

The signals in each band are fed to a multiplexer which functions to code the information in each band so that the multiplexed information at the filter output is given an appropriate identiy prior to being fed to microprocessor 50.

Figure 3:
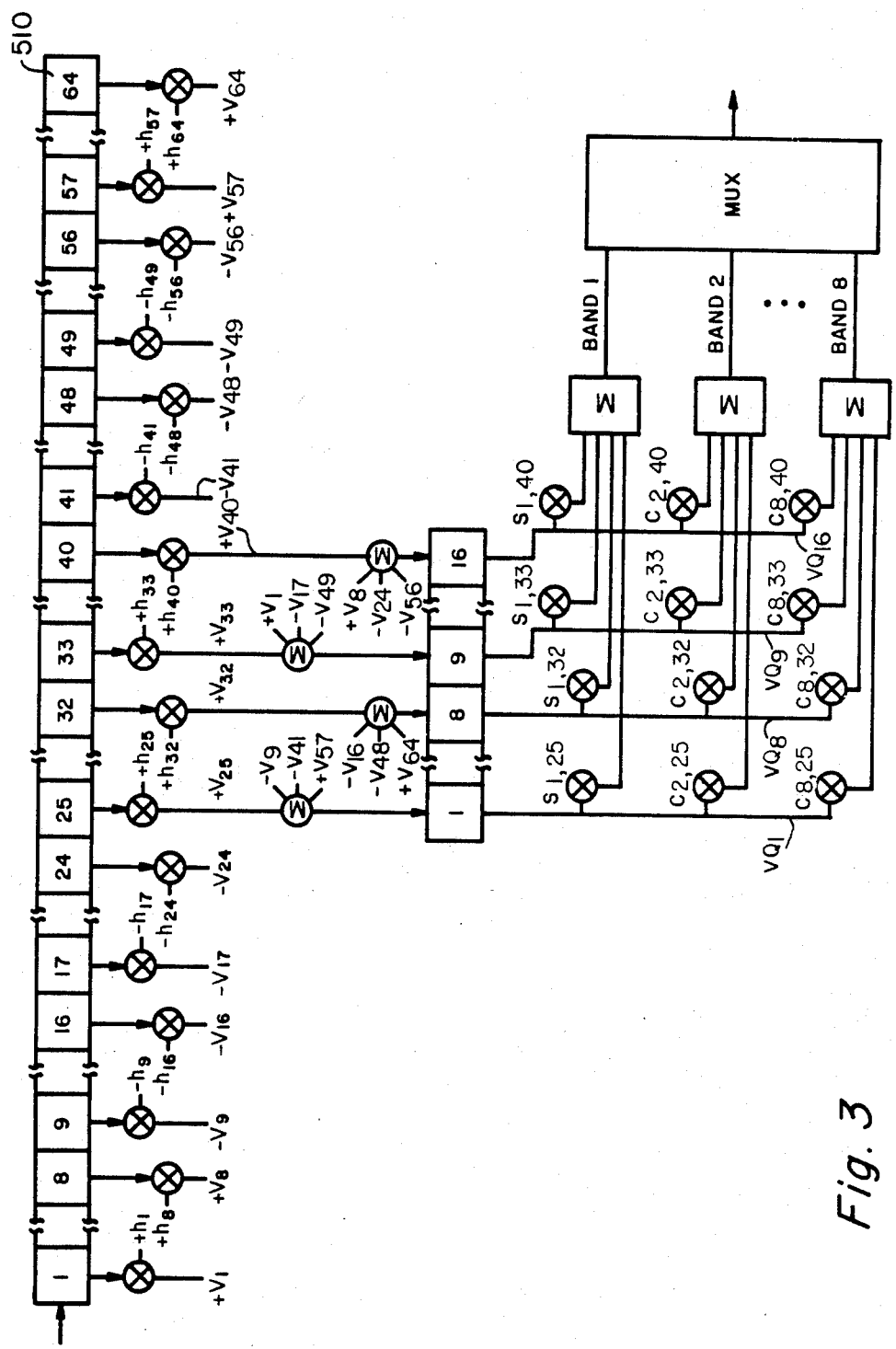

FIG. 3 is a functional diagram used to illustrate that the number of computations and the corresponding hardware shown in FIG. 2 can be reduced. The reduction results from the repetitive characteristic of the sine and cosine functions used to generate the subbands, in accordance with the invention.

In FIG. 3, a 64 stage shift register 510 is used, instead of the 80 stage register 410 of FIG. 2. The choice of 64 stages is somewhat arbitrary but the choice of frequencies and bands makes for divisions by whole numbers. The 64 samples ($r_i$) stored in the 64 stages of register 510 are multiplied by 64 corresponding $h_i$ coefficients to produce 64 corresponding $V_i$ products. However, observe that certain of the $h_i$ coefficients are multiplied by a ($-1$) for reasons discussed below. The 64 $V_i$ products are arranged in 16 groups of 4, and the four $V_i$ products of each group are summed to produce 16 distinct $V_{sj}$ values. The 16 $V_{sj}$ values are then multiplied by the sine and cosine functions to produce eight bands (Band 1, Band 2, . . . Band 8) similar to those obtained for FIG. 2. That certain $V_i$ products may be grouped is based on the recognition of the existence of certain symmetric patterns associated with sinusoids. This may be illustrated as follows: Sampling at an 8 KHz provides 32 samples in one cycle of the sin 250 Hz signal. Referring to waveform A of FIG. 13 and examining a portion of the 250 Hz signal encompassing 32 samples or points, note that the amplitude of point 1 is equal to that of point 17 but with a sign reversal (i.e. $-1$). This observation applies to every 16th point. Likewise, a repetitive pattern exists for the other sine and cosine functions. In general, the full sine and cosine waveforms repeat every 4M points, where M is the number of bands, and there is a repetition every 2M points with a negative sign. For $M=8$ and $fs=8000$ Hz, there is exact repetition every 32 points, and a repetition with sign reversal every 16 points.

The grouping of terms is now further explained. Recall that the bands were obtained by summing products of $V_i$ and sinusoid coefficients. A portion of Eq. B1 applicable to the system of FIG. 3 may be expressed as follows:

$$BAND\ 1 = r_1 h_1 S_{1,1} + \ldots + r_{17} h_{17} S_{1,17} + \ldots + r_{33} h_{33} S_{1,33} \ldots + V_{49} h_{49} S_{1,49} + \ldots \quad \text{Eq. B11}$$

From FIG. 13 note that:

$$S_{1,1} = (-1) S_{1,17} = S_{1,33} = (-1) S_{1,49}$$

Hence, Equation B1 may be rewritten as the summation of 16 products with each product being equal to a $VQ_j$ multiplied by corresponding sinusoid coefficient:

$$BAND\ 1 = [VQ_1 S_{1,1}] + [VQ_2 S_{1,2}] + \ldots + [VQ_{16} S_{1,16}] \quad \text{Eq. B12}$$

Where, for example, $$VQ_1 = r_1 h_1 - r_{17} h_{17} + r_{33} h_{33} - r_{49} h_{49}$$

Thus certain $h_i$ coefficients may be multiplied by ($-1$) prior to multiplying their corresponding $V_i$'s to enable appropriate $V_i$ products to be grouped to produce fewer $VQ_j$ which are then multiplied by fewer sinusoid coefficients.

For the system of FIG. 3, the 64 $V_i$'s are grouped into 16 $VQ_j$ groups each group comprising the summation of 4 $V_i$ values. The 16 $VQ_j$ sums are then multiplied by 8 sets of 16 sinusoidal coefficients. Then, each band is produced by the summation of 16 ($VQ_j$ and sinusoidal) products. This compares to the need for 64 summations to obtain each band if the teachings of FIG. 2 were followed.

Figure 4:
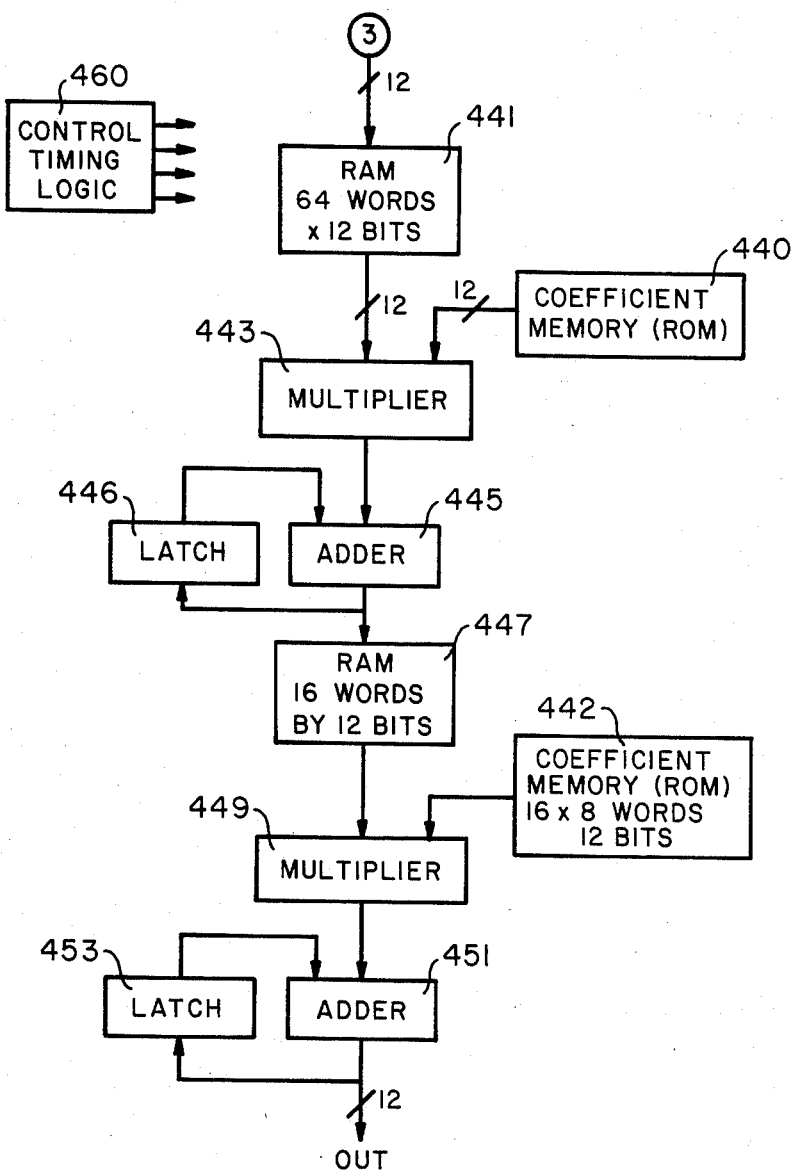
FIG. 4 is a simplified block diagram of a transmit filter bank embodying the invention.

A filter bank of the type shown functionally in FIG. 3 may be constructed as shown in FIG. 4. The $h_i$ coefficients of the low pass filter computed as described below are stored in a read only memory (ROM) 440 while the coefficients for 8 sets of sinusoids are stored in a read-only memory (ROM) 442. In the circuit of FIG. 4, the bits from A/D converter 30 are written into a random-access-memory (RAM) 441 whose outputs are fed into a multiplier 443. The outputs of ROM 440 are also coupled into multiplier 443 to perform the multiplication necessary to generate the $V_i$ signals. The $h_i$ coefficients multiplied by a $(-1)$ may be so stored in ROM 440 or the multiplication of the appropriate $h_i$ coefficients by $-1$ may be accomplished under the control of control circuit 460 prior to, or during, the multiplication by multiplier 443. The output of multiplier 443 is coupled to an adder 445, which is programmed to combine the $V_i$'s multiplied by the same sinusoidal values as discussed for FIG. 3. Latch 446 in combination with adder 445 and under the control of circuit 460 functions to sum the appropriate $V_i$'s whereby the 16 $VQ_j$ sums are produced at the output of adder 445. The outputs of adder 445 are then fed to a random access memory (RAM) 447 for temporary storage. The $VQ_j$ outputs from RAM 447 and 8 sets of 16 sinusoids coefficients stored in ROM 442 are fed to multiplier 449 which is programmed to multiply the $VQ_j$ products by their corresponding sinusoid coefficients. The output of multiplier 449 is then fed to adder 451 which, in combination with latch 453, functions to complete all the necessary summations and to produce the eight desired bands which are effectively multiplexed at the output of Adder 451. The generation of appropriate timing and synchronization pulses is not detailed, but may be accomplished by means of control and timing logic circuit 460.

The multiplexed bands produced at the output of adder 451 which is also the output of filter bank 40 is applied to microprocessor 50 and thence transmitted in a serial stream via transmission system 60 to a receiver system. The information received by the receiver system is first applied to a microprocessor 70 in which the data samples are reassembled in an order corresponding to its form at the sending end ⑤. The microprocessor 70 is keyed to the transmitter. That is, the receiver can accept the transmitted information and reassemble it in a meaningful manner. The output ⑦ of the reassembling microprocessor 70 is then applied to a receiver filter bank 80.

Before continuing with a description of the data flow, certain characteristics and requirements of the filter bank will be examined. Included is a discussion of the low pass filter followed by a discussion on the cancellation of aliasing.

The starting point for the filter bank is the generation of a finite impulse response (FIR) low pass filter having characteristics to meet the following two requirements:
(1) The attenuation of the input signal components above fMAX/M must be sufficiently great that images of those components can be ignored; where fMAX is the maximum bandwidth of the input signal assuming the origin at f=0 Hz and M the number of bands. For example, in speech transmission, 40 to 60 decibels of attenuation is typically acceptable. This corresponds to attenuation by a factor of 100 to 1000. This requirement is typicallly met by selecting a sufficiently large number of h coefficients; and
(2) The frequency response of the filter must be such that the following relationship between H(f) and H[(fMAX/M)-f]—must be satisfied:

$$|H(f)|^2 + |H[(fMAX/M)-f]|^2 = 1 + \epsilon \qquad \text{eq. 1.}$$

Where: H(f) represents the frequency characteristic of the filter in the frequency domain; H[(fMAX/M)-f] may be viewed as the low pass filter response reverse and shifted in frequency; and $\epsilon$ is an error term which should be made small.

The significance of equation 1 is that, where two bandpass filters overlap (i.e. region where aliasing exists) the high frequency edge of the lower frequency filter will have a shape like H(f), while the lower frequency edge of the higher frequency filter will be shaped like H[(fMAX/M)-f]. Therefore, equation 1 should be satisfied to ensure that the sum of the gains of the two overlapping filter bands will add to a value of 1 in the region of the spectrum where they overlap. The filter response is squared in equation 1 because the reconstructed signal is affected by two identical filters in each band, once in the transmit filter bank and once in the receive bank.

Figure 12:
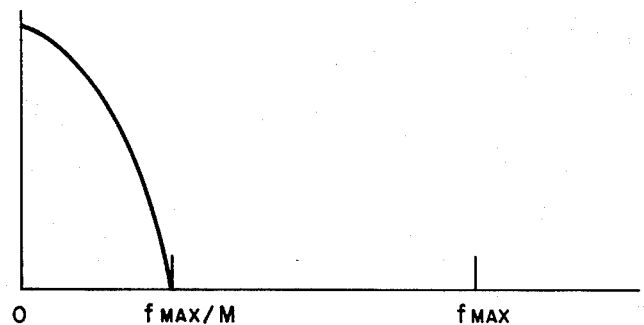
FIG. 12 is a drawing of a waveform illustrating a suitable shape for the frequency response of a low pass filter embodying the invention.

A low pass filter having approximately the desired passband shape to satisfy Eq. 1 and the desired attenuation above fMAX/M shown in FIG. 12 may be designed using standard low pass filter design techniques, such as the window method or the Remez exchange algorithm. Either of these methods yield approximate values of the $h_i$ coefficients which define to a first approximation a low pass filter satisfying the two requirements discussed above. This approximate filter is designed to have a passband extending from zero frequency to fMAX/2M and a stopband (i.e., a region where frequency components are highly attenuated) beginning at fMAX/M and extending therefrom.

The number (N) of $h_i$ coefficients required has been found to increase as the number of bands desired increases, as the desired attenuation above fMAX/M increases, and as the maximum allowable value of $\epsilon$ decreases.

This approximate filter may be optimized using an optimization method (such as the Hooke and Jeaves algorithm). In this optimization step, the values of the coefficients ($h_i$'s) are iteratively adjusted so as to minimize the average value of $\epsilon$ in equation 1 and to maximize the attenuation of signal components above fMAX/M. The desired number of h coefficients and their respective values are thus obtained; where the h coefficients define the impulse response of the low pass filter.

Filter design procedures of this type consisting of the design of an approximate filter followed by an optimization step are known. Such procedures have been used extensively to design filters for use in QMF filter banks. The procedures used to design low pass prototype filters for use in filter banks embodying this invention differ from those used to design QMF filters in the width of the passband and in the location of the stopband. Requirements 1 and 2 above differ from the requirements for the generation of coefficients for a quadrature mirror filter. For a 2 band filter using the QMF method, parameter M in equation 1 would be set equal to the value 1, while for a 2 band filter embodying the invention, M is set equal to 2. Also, the low pass prototype filter used in this invention is designed such that frequency components above fMAX/M (i.e., fMAX/2 for a 2 band filter) are sufficiently attenuated. In comparison, a QMF filter would be designed to attenuate all frequency components above an arbitrarily selected frequency between fMAX/2 and fMAX.

The constraints of equation 1 above, if met, assure that the gain of the filter will be almost constant in the regions where bands overlap and that there will be no overlap between bands that are not adjacent. That is, for example, bands 2 and 3 overlap but bands 2 and 4, effectively, do not.

Cancellation of aliasing is achieved as a result of the way in which the low pass filter coefficients are converted into coefficients for bandpass filters. Each bandpass filter is formed by multiplying the $h_i$ coefficients of the low pass prototype by a sinusoid having a frequency eaual to the center frequency of the desired band. The most general form of the equation for the sinusoid used to generate the band m filter is:

$$g_{m,i} = [Re(a_m)] \cos[\pi(m-\tfrac{1}{2})(i-N/2\tfrac{1}{2})/M] - [Im(a_m)] \sin[\pi(m-\tfrac{1}{2})(i-N/2\tfrac{1}{2})/M] \quad \text{eq. G1}$$

and the equivalent bandpass filter has coefficients
$$h_{m,i} = g_{m,i} h_i$$
where: $a_m$ is a complex constant, Re and Im denote respectively the real and imaginary parts of the complex constant $a_m$, N is the number of coefficients in the filter, M is the number of bands, and g is the value of sample i of the sinusoid for band m. In equation G1, i ranges from 1 to N, while m ranges from 1 to M.

Applicant has proved mathematically that cancellation of aliasing components may be achieved if the following two requirements are met:

(1) The sinusoids used to generate the bandpass filters in the receiver filter banks satisfy the following:

$$g_{m,i} = [Re(a_m)] \cos[\pi(m-\tfrac{1}{2})(i-N/2\tfrac{1}{2})/M] + [Im(a_m)] \sin[\pi(m-\tfrac{1}{2})(i-N/2\tfrac{1}{2})/M] \quad \text{Eq. G2}$$

and the equivalent receiver bandpass filter has coefficients
$$h_{m,i} = g_{m,i} h_i$$

Comparing Eqs. G1 and G2 it is seen that multiplying the second term of equation G1 by $(-1)$ produces equation G2 and satisfies requirement (1). For example, this condition may be implemented by making the sine functions used in the receiver equal to the opposite or negative of the sine functions used in the transmit filter bank while maintaining the cosine function in the receiver the same as those in the transmitter.

(2) for cancellation of aliasing, the $a_m$ parameters for adjacent bands must be related by the relationship $$a_m = j a_{m-1} \text{ or } a_m = -j a_{m-1}$$

The coefficient $a_m$ is a complex constant of magnitude (modulus) one, and $j = \sqrt{-1}$. The significance of this equation is that the constant $a_m$ for one band is obtained by multiplication of the constant for the preceding band by j or $-j$ (either may be used). This multiplication by j or $-j$ causes the sinusoids for adjacent bands to be shifted in phase by 90 degrees relative to one another.

The selection of the $a_m$ values (one for each band) determines the way in which the filter bank is implemented and functions. To reconstruct the signal at the output of the reconstruction filter bank with flat frequency response at zero frequency and at fMAX, it is necessary to select the initial constant $a_1$ such that the following relationship is satisfied:

$$a_1^4 = -1; \text{ where } a_1 \text{ is constant for band 1} \quad \text{eq. 10}$$

so that $a_1$ may take on any of the following values:

$$(1+j)/\sqrt{2} \quad (11a)$$
$$(1+j)/\sqrt{2} \quad (11b)$$
$$(-1+j)/\sqrt{2} \quad (11c)$$
$$(-1-j)/\sqrt{2} \quad (11d)$$

In many applications, such as the transmission of speech signals, the frequency components near zero and fMAX are unimportant, so there is no need to preserve the amplitude of these components. In this case, there is no requirement that Equation 10 be satisfied, so $a_1$ may take on any convenient value. To simplify the implementation, it is desirable that $a_1$ be either pure real or pure imaginary; (for example $a_1 = 1$ or $a_1 = j$). In the latter case, the relations for the $a_m$ of adjacent bands will yield values for all the $a_m$ that are pure real or pure imaginary. Then, in equations G1 and G2, either the sine function or the cosine will disappear for each filter and a cosine or sine term will remain. As an example, let $a_1 = j$. then one possible set of values for the $a_m$'s for 8 bands is:

$$a_1 = -j$$
$$a_2 = 1$$
$$a_3 = -j$$
$$a_4 = 1$$
$$a_5 = -j$$
$$a_6 = 1$$
$$a_7 = -j$$
$$a_8 = 1$$

Inserting these values in equation G1 above, the sinusoids for the odd numbered bands are given by the equation $$g_{m,i} = \sin[\pi(m-\tfrac{1}{2})(i-N/2\tfrac{1}{2})/M] \quad \text{eq. G3}$$

and the sinusoids for the even numbered bands are given by $$g_{m,i} = \cos[\pi(m-\tfrac{1}{2})(i-N/2\tfrac{1}{2})/M] \quad \text{eq. G4}$$

Note that equations G3 and G4 may be used to generate the same set of coefficient sinusoid values as equations C1 and C2 presented in describing FIG. 2.

However, note that obtaining the odd numbered bands by using sine function as in Eq. G3 and obtaining the even numbered bands by using cosine functions as per Eq. G4 depends on the values assigned to the complex constant "a". Other values of the complex constant "a" may be used whereby the odd numbered bands may be generated using cosine functions and the even numbered bands may be generated using sine functions.

By way of example, the values calculated using Eqs. G3 and G4 lead to a set of bandpass filters obtained by multiplying the low pass prototype coefficients by a sine wave for odd numbered filter bands and by a cosine wave for even numbered filter bands. For a low pass prototype filter symmetric coefficients, (e.g. for a 64 stage filter $h_1 = h_{64}$, $h_2 = h_{63}$) this set of values causes the reconstructed signal component amplitudes to decrease to zero at zero frequency and at fMAX. If the set of values is chosen such that the end ($a_1$ and $a_m$) coefficients are one, the amplitudes would be increased by a factor of 2 at zero and fMAX. The receiver filter designed to satisfy the above will enable the aliasing components to be cancelled.

Figure 5:
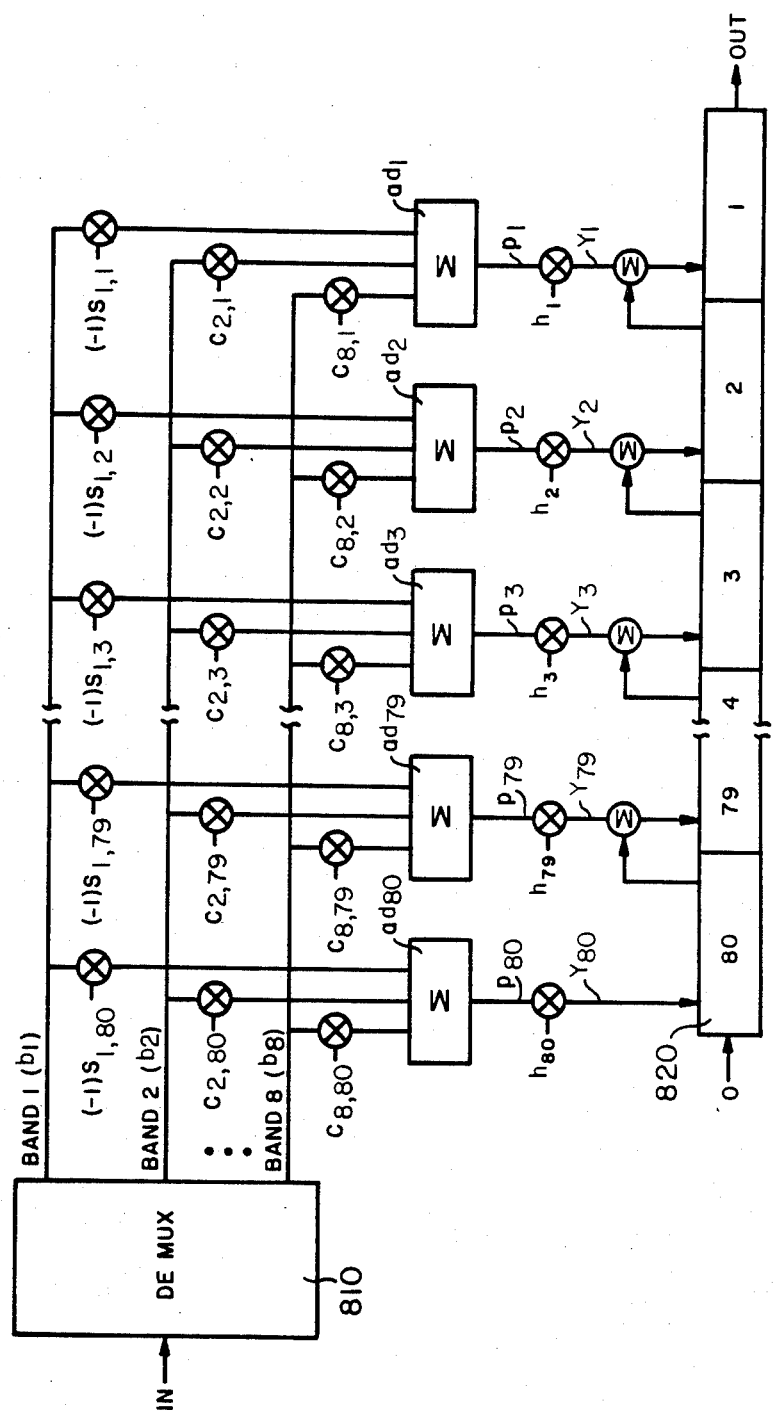
FIGS. 5 and 6 are functional block diagrams of receiver filter banks embodying the invention.

FIG. 5 is a functional block diagram of a receiver filter bank 80 embodying the invention. It essentially performs the reverse of the filter bank shown in FIG. 2 since it functions to recover the original signal by filtering each band to extract the original signal in that band and to recombine the bands. While transmit filter bank 40 stores in a shift sampled input values applied to the filter, receiver filter bank 80 uses an implementation which accumulates output values in a shift register.

The serial multiplexed incoming signal received from microprocessor 70 is applied to a demultiplexer 810 which separates the serial input signal into 8 distinct subbands corresponding to the 8 subbands produced in filter 40 prior to the multiplexing of the 8 bands. The input signal is applied at a rate of 8 KHz to DEMUX 810 which produces signals at its 8 outputs (BANDS 1 through 8) at a 1 KHz rate. Each millisecond, 8 samples denoted as 1 through 8, that is, one sample per band, is produced at the output of DEMUX 810. Each sample ($b_i$) is multiplied by a set of 80 sinusoidal coefficients. Where filter bank 80 of FIG. 5 is paired with filter bank 40 of FIG. 2, the odd bands (1, 3, 5, 7) of filter 80 are multiplied by 80 coefficients of sine functions as in FIG. 2 while the even bands (2, 4, 6, 8) are multiplied by coefficients of cosine functions as in FIG. 2. Furthermore, the cosine values used in receiver filter bank 80 will be the same as the corresponding values in transmit filter bank 40. However, each sine value in FIG. 5 is made the negative of the corresponding value in transmit filter bank 40. As the transmit filter bank, the phase of the sinusoids multiplying or associated with adjacent bands must be shifted by 90° relative to each other. Thus, as for the transmit filter bank, if a band is generated, or reconstructed, by a sine function, its adjacent bands must be generated or reconstructed, by a cosine function. In addition, where the cosine function in the receiver filter is kept in phase with the cosine function in the transmit filter, the sine function must be opposite to or the inverse of the sine function in the transmit filter. Satisfying those relationships enables cancellation of the aliasing components.

Each one of 80 adders ($ad_j$) is used to sum 8 products, where the 8 products are produced by multiplying the corresponding band samples ($bm$) by the sinusoid coefficient corresponding to the order of $ad_j$. For example, the sum output ($p_j$) of $ad_j$ is equal to:

$$P_i = b_1(-1)S_{1,i} + b_2C_{2,i} + b_3(-1)S_{3,i} + \ldots + b_8C_{8,i}$$

The output sums ($p_i$) of the $ad_j$ adders are multiplied by the corresponding $h_i$ coefficients to produce 80 $Y_i$ signals. The $h_i$ coefficients in the receiver bank have the same values as the corresponding $h_i$'s used in the paired transmit filter bank. Designating the samples of bands 1–8 by $b_1$ through $b_8$, respective $y_i$ values may be expressed as:

$$Y_1 = [b_1(-1)S_{1,1} + b_2C_{2,1} + b_3(-1)S_{3,1} + b_4C_{4,1} + \ldots + b_8C_{8,1}]h_1 \quad \text{eq. D1}$$

$$Y_2 = [b_1(-1)S_{1,2} + b_2C_{2,2} + b_3(-1)S_{3,2} + b_4C_{4,2} + \ldots + b_8C_{8,2}]h_2 \quad \text{eq. D2}$$

When the 80 $Y_i$ samples have been generated they are added to the contents of an output storage device such as shift register 820 and the contents of the storage device are effectively shifted to the right. That is, the new value in location 1 is the old value in location 2 plus $Y_1$, while the new value in location 2 is the old value in location 3 plus $Y_2$, etc.

While the $b_1$ through $b_8$ values and the $Y_i$ values are generated at a 1 KHz rate, the data at the output of register 820 is generated at an 8 KHz rate. That is, the data in register 820 is shifted at a 8 KHz rate, which is 8 times for every set of $Y_1$'s generated. To allow for this difference in rates, a standard signal processing technique known as interpolation is used. That is, zero valued samples are effectively inserted into the band 1 through band 8 data stream to produce a sampling rate of 8 KHz. Multiplication of these zero values by the sinusoid coefficients is not actually (and need not be) performed. Instead, since the $Y_i$ values are all zero if $b_1$ through $b_8$ are all zero, the same effect may be achieved by simply shifting the contents of the shift register to the right seven times.

The sequence of operations is then as follows: During one 125 microsecond interval the samples $b_1$ through $b_8$ at the output of the demultiplexer are multiplied by sinusoids, added, and multiplied by h coefficients to generate the $Y_i$ values. These new values are added to the previously stored contents of shift register 820 as described above. During the next 7 intervals of 125 microseconds, the shift register is shifted to the right by one stage during each one of the 7 intervals of 125 microseconds while the $Y_i$'s do not change value. As indicated, a zero value is shifted into register location 80 during the seven shifts. Following these 7 shifts, another set of values $b_1$ through $b_8$ are available from the demultiplexer, and the process repeats.

Figure 10:
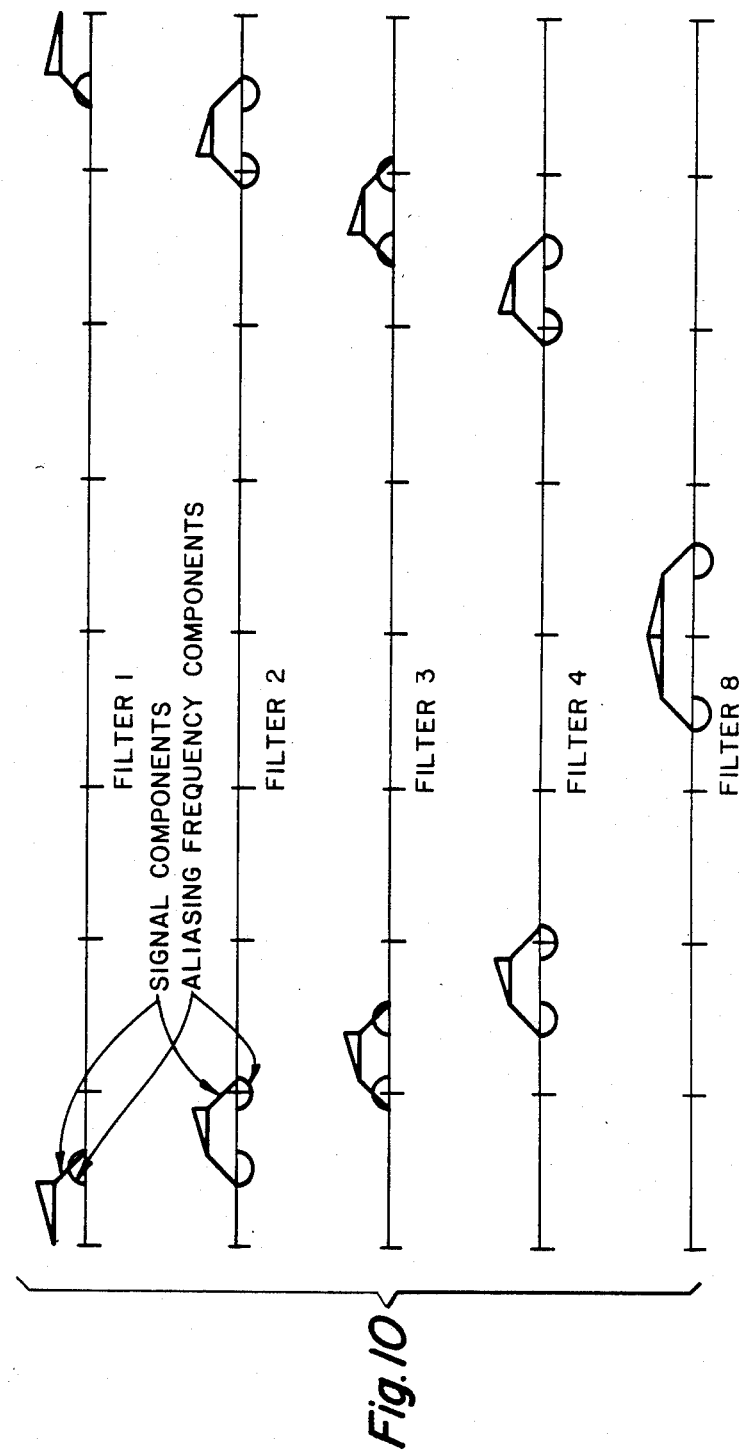
Figure 11:
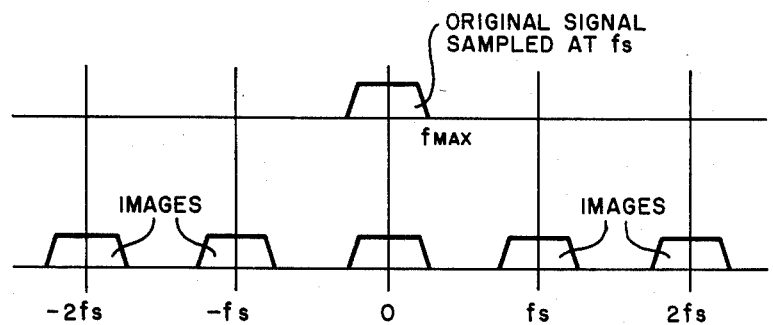
FIG. 11 is a drawing showing a waveform illustrating the Nyquist Criteria.

The signals at the output of register 820 are all very similar to the $r_i$ signals applied to register 410 of FIG. 2 and the aliasing components have been cancelled. Cancellation of aliasing is achieved within the structure depicted in FIG. 5. The output signal is effectively the sum of the output signals of 8 bandpass filters, which consist of the desired signal bands along with aliasing components as depicted in FIG. 10. Because of the way in which the sinusoids generating the bandpass filters are chosen, the aliasing components of adjacent bands are equal in magnitude but opposite in sign. Therefore, when the signals in the different bands are added, the aliasing components of adjacent bands cancel one another and do not appear at the output of the filter bank.

Figure 6:
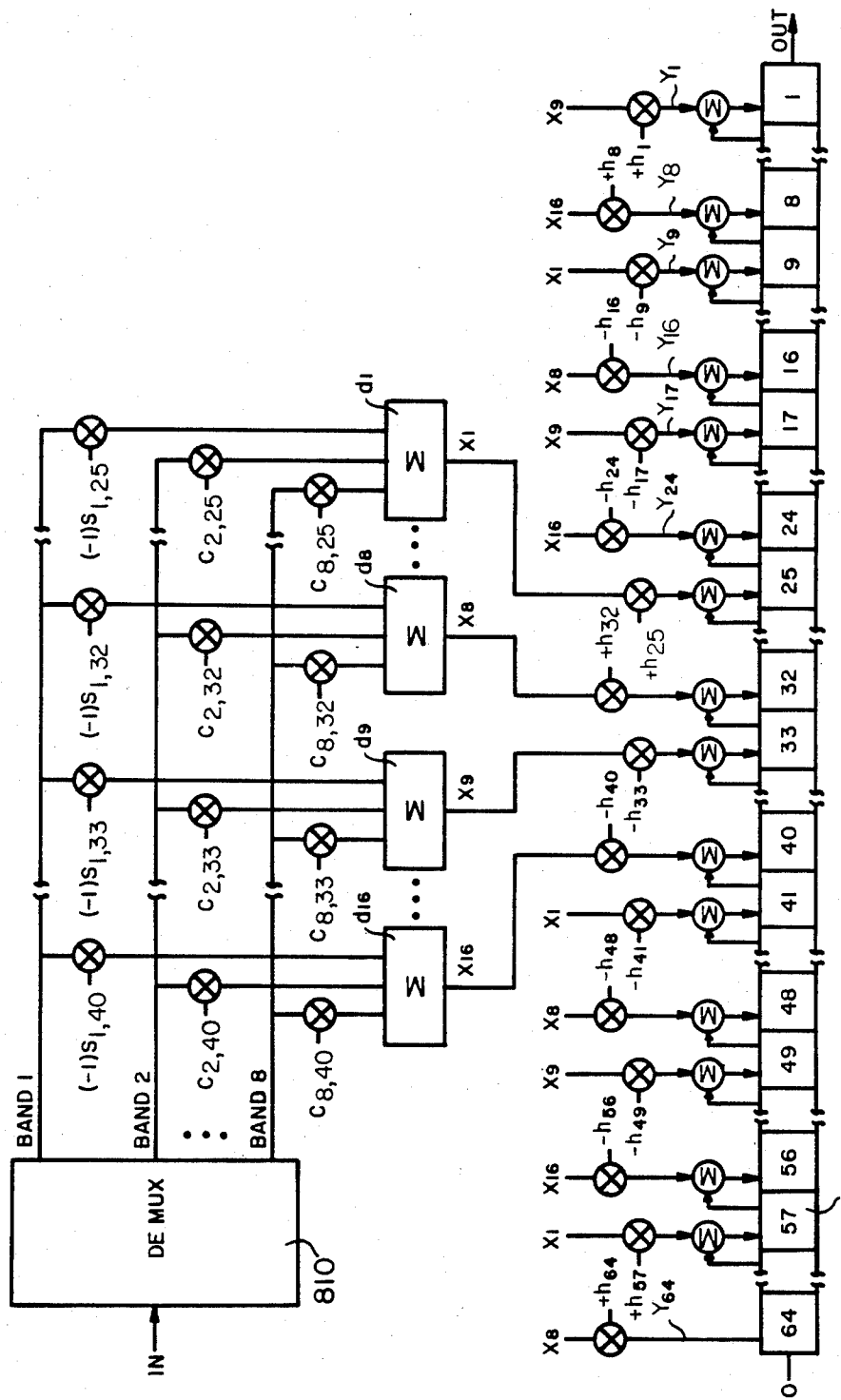

FIG. 6 is a functional block diagram of a receiver filter bank in which use is made of the symmetry of the sinusoids to reduce the number of computations and the accompanying hardware.

The principles underlying the simplification are similar to those discussed for FIG. 3 and need not be repeated.

This version, as is the case for the transmit filter bank of FIG. 3, reduces the number of operations required by taking advantage of the repetitive nature of the sinusoids. As was indicated for the transmit filter, the sinusoid frequencies are such that there are an integral number of cycles in 4M points or an integral number of half cycles in 2M points. Therefore, for an 8 band filter bank (M=8), a sinusoid sample value i will be equal to the value of sample i+16 with the sign reversed. As a result of this repetition, only the 16 values x1 through x16 need to be calculated. The outputs of the other adders in FIG. 6 are equal to either the xi's or to the xi's with their signs reversed. Thus, FIG. 6 shows 16 adders (d1 through d16) for producing 16 sums (xi), each xi being the sum of 8 products with each product comprising the multiplication of a band sample ($b_i$) by a corresponding sinusoid coefficient. The 16 center sinusoid coefficients were selected to perform the products multiplication.

The 16 unique values x1 through x16 are generated in the same way that the 16 center values (P25 through P40) in FIG. 5 would be generated. These values are then multiplied by the $h_i$ coefficients as indicated in FIG. 6. Where a negative value of the xi is desired, the same effect is achieved by negating the corresponding h coefficient.

Figure 7:
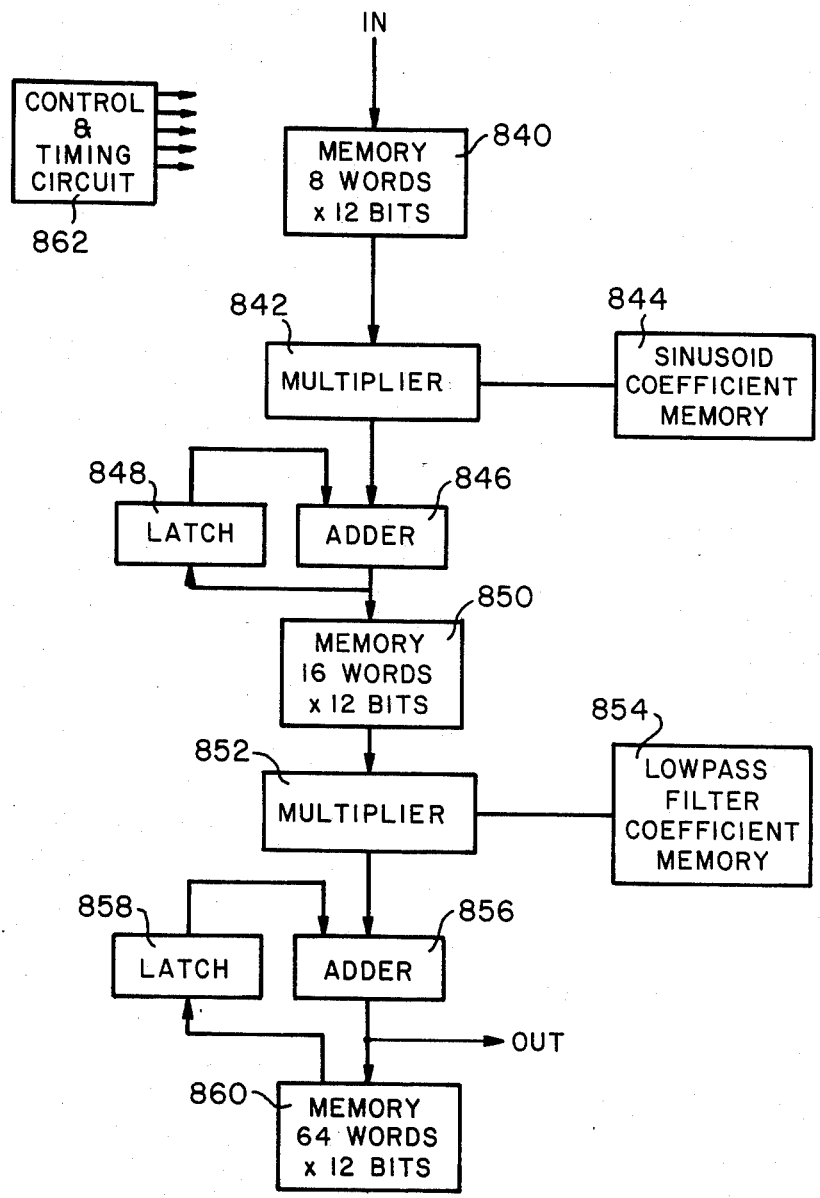
FIG. 7 is a block diagram of a receiver filter bank embodying the invention.

A filter bank of the type shown in FIG. 6 may be implemented as shown in FIG. 7. FIG. 7 is in effect the reverse of the circuit of FIG. 4. The serial output of microprocessor 70 is applied to the input of a RAM 840 whose 8 word (of 12 bits each) output is applied to a multiplier 842. A ROM, 844, in which are stored the coefficients of the sine and cosine functions described above for FIGS. 5 and 6 is also coupled to multiplier 842. The outputs of multiplier 842 are applied to adder 846 which together with latch 848 functions to perform the summation, shown functionally for d1 through d16 in FIG. 6. The xi sums produced at the output of adder 846 are stored in RAM 850 capable of storing at least 16 words of 12 bits. The outputs of RAM 850 are coupled to a multiplier 852. The $h_i$ coefficients of the low pass filter are stored in a ROM 854 which is also coupled to multiplier 852. The $h_i$ coefficients may be stored in ROM 854 together with appropriate sign $(-1)$ or $(+)$ or, alternatively, a control circuit 862 may be programmed to generate suitable signs for the $h_i$ values. The products of the $h_i$ and $x_i$ results in the generation of $Y_i$ values as shown functionally in FIGS. 5 AND 6.

The output of adder 856 is applied to RAM 860 which must be capable of storing at least 64 words, of 12 bits length. The contents of memory 860 are selectively fed back via a latch 858 to adder 856 to add the $Y_i$ values to the contents of the memory as shown in FIGS. 5 and 6.

A system in which M=8 has been used to illustrate the invention. However, a different number of bands may be used and in fact, applicant designed and simulated the systems in which 5 bands were employed. That is, the signal was divided into 5 subbands and the 5 subbands were then recombined as taught herein.

The sine and cosine functions used to illustrate the invention were symmetrical with respect to the center of the filter as shown in waveforms A and B of FIG. 13. That is, at the center of the filter sine 250 is equal to zero and cosine 750 is a maximum.

The symmetrical condition may be modified by shifting the sine abd cosine curves to the right or to the left so long as they are shifted by the same number of degrees. In FIG. 13, the sinewave of 250 Hz could be shifted 45° to the right and the cosine wave of 750 Hz could also be shifted 45° to the right. However, the shape of the sine and cosine function with respect to the X axis would maintain the general shape shown in FIG. 13.

What is claimed is:

1. In a signal processing system including a signal transmitting system in which a signal processed for transmission is separated by a transmit digital filter means into several subbands, the improvement comprising:

means in said transmit digital filter means for generating said subbands including sine and cosine functions, the sine functions for generating every other one of said subbands and the cosine functions for generating the remaining ones of said subbands; and wherein said sine and cosine functions are phased to preserve all components of the transmitted signal.

2. In the signal processing system of claim 1, the improvement further including a signal receiving system in which the received signals are processed by a receiver digital filter means for reconstituting said transmitted signals; and means in said receiver digital filter means including sine and cosine functions to reconstitute said transmitted signals, the sine functions for reconstituting said every other one of said subbands and the cosine function for reconstituting said remaining one of said subbands.

3. In the signal processing system as claimed in claim 2, means for inverting the sign of said sine functions in said receiver filter means relative to their values in said transmit filter means, and means setting the values of said cosine functions in said receiver equal to their values in said transmit filter means.

4. A method of splitting a signal having a bandwidth of fMAX into M consecutive subbands, each subband having a bandwidth of fMAX/M, comprising the steps of:

(a) sampling said signal via an analog to digital converter and producing signal samples;

(b) generating a low pass filter of bandpass fMAX/2M whose impulse response is defined by coefficients $h_i$; where i ranges from 1 to N and where N is an integer greater than 1;

(c) multiplying said signal samples by said coefficients $h_i$ for producing intermediate signals $V_i$;

(d) generating the coefficients of a sine function having a frequency equal to $\{[fMAX/2M]\cdot(2m_1-1)\}$, where $m_1$ is one of an odd and an even integer within a range from 1 to M;

(e) generating the coefficients of a cosine function having a frequency equal to $\{[fMAX/2M]\cdot(2m_2-1)\}$, where $m_2$ is the other one of said odd and even integer within the range of 1 to M; and (f) multiplying said intermediate signals $V_i$ with the coefficients of said sine and cosine functions for producing said "M" consecutive subbands, said subbands being phased to preserve all components of said signal.

5. A digital filter for processing a signal of bandwidth fMAX comprising:

a first signal processing means, functioning as a low pass filter, having a bandpass equal to fMAX/2M and whose impulse response is defined by $h_i$ coefficients; where i ranges from 1 to N, where N and M are integers greater than 1; where fMAX is equal to the maximum frequency of signals being processed; and M is the number of subbands into which the signal bandwidth is divided;

means coupling said signal to be processed to said first signal processing means for multiplying said signal to be processed with said $h_i$ coefficients and producing a first output;

means for generating the coefficients of a sinusoidal function where the coefficients are defined by:

$g_{m,i} = [Re(a_m)] \cos[\pi(m-\frac{1}{2})(i-N/2\frac{1}{2})/M] - [Im(a_m)] \sin[\pi(m-\frac{1}{2})(i=N/2\frac{1}{2})/M]$ Re and Im denote, respectively, the real and imaginary parts of the complex constant $a_m$; and where $a_m$ is a complex constant having one of four values $[\pm 1 \pm j]/\sqrt{2}$; where j is equal to the $\sqrt{-1}$; and where m ranges from 1 to M; and means for multiplying said first output with said coefficients of said sinusoidal functions for producing M consecutive subbands phased to preserve all components of said signal.

6. In a signal processing system including a signal transmitting system in which a signal processed for transmission is separated by a transmit digital filter means into M consective subbands, a circuit for producing M consecutive bandpass filters for separating said signal into said M consecutive subbands, each filter having a bandwidth of fMAX/M, comprising:

(a) means for generating a low pass filter of bandpass fMAX/2M whose impulse response is defined by coefficients $h_i$; where i ranges from 1 to N and where N is an integer greater than 1;

(b) means for multiplying said signal to be processed with said coefficients $h_i$, and producing an intermediate product;

(c) means for generating the coefficients of a sine function having a frequency equal to $\{[fMAX/2M] \cdot (2m_1 - 1)\}$, where $m_1$ is one of an odd and an even integer within a range from 1 to M;

(d) means for generating the coefficients of a cosine function having a frequency equal to $\{[fMAX/2M] \cdot (2m_2 - 1)\}$, where $m_2$ is the other one of said odd and even integer within the range of 1 to M; and (e) means for multiplying said intermediate product with the coefficients of said sine and cosine functions for producing said consecutive bandpass filters, said bandpass filters being phased to preserve all components of said signal.

* * * * *

UNITED STATES PATENT AND TRADEMARK OFFICE
CERTIFICATE OF CORRECTION

PATENT NO. : 4,691,292

DATED : September 1, 1987

INVENTOR(S) : Joseph H. Rothweiler

It is certified that error appears in the above-identified patent and that said Letters Patent is hereby corrected as shown below:

Column 7, line 8, "states" should be --stages--.

Column 12, line 3, "(1+j)/ 2" should be -- (1-j)/ 2 --.

Column 13, line 24, "1 through 8" should be --$b_1$ through $b_8$--.

Column 13, line 37, add "for" before --the-- (first occurrence).

Column 15, line 57, "abd" should be --and--.

Column 17, line 8, insert "where" before --Re and Im denote,--.

Signed and Sealed this

Twenty-third Day of February, 1988

Attest:

DONALD J. QUIGG

*Attesting Officer*   *Commissioner of Patents and Trademarks*